: US006757885B1

United States Patent
Adusumalli et al.

(10) Patent No.: US 6,757,885 B1
(45) Date of Patent: Jun. 29, 2004

(54) LENGTH MATRIX GENERATOR FOR REGISTER TRANSFER LEVEL CODE

(75) Inventors: Srinivas Adusumalli, San Jose, CA (US); Juergen Lahner, Sunnyvale, CA (US); Balamurugan Balasubramanian, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 10 days.

(21) Appl. No.: 10/334,570

(22) Filed: Dec. 31, 2002

(51) Int. Cl.[7] .............................................. G06F 17/50
(52) U.S. Cl. ............................ 716/18; 716/8; 716/11
(58) Field of Search ................................ 716/18, 11, 8

(56) References Cited

U.S. PATENT DOCUMENTS

| | | | |
|---|---|---|---|
| 4,630,219 A | * 12/1986 | DiGiacomo et al. | ........... 716/9 |
| 5,555,201 A | 9/1996 | Dangelo et al. | |
| 5,930,147 A | * 7/1999 | Takei | ............................ 716/8 |
| 5,963,730 A | * 10/1999 | Toyonaga et al. | ............... 716/3 |
| 6,145,117 A | 11/2000 | Eng | |
| 6,289,498 B1 | 9/2001 | Dupenloup | |
| 6,292,931 B1 | 9/2001 | Dupenloup | |
| 6,360,356 B1 | 3/2002 | Eng | |
| 6,378,123 B1 | 4/2002 | Dupenloup | |
| 6,421,818 B1 | 7/2002 | Dupenloup et al. | |
| 6,438,730 B1 | 8/2002 | Atmakuri et al. | |

OTHER PUBLICATIONS

Focus Report: Logic Synthesis and Silicon Compilation Tools by Steven E. Schulz, Eedesign; http://www.eedesign-.com/eedesign/focusreport9605.html.

* cited by examiner

Primary Examiner—Vuthe Siek
Assistant Examiner—Sun James Lin
(74) Attorney, Agent, or Firm—Fitch, Even, Tabin & Flannery

(57) ABSTRACT

A method of generating a length matrix for register transfer level code includes steps for receiving as input register transfer level code, an I/O block list, a plurality of compile units, and a user defined hierarchical depth; mapping the register transfer level code to a design library, generating a connectivity matrix for the plurality of compile units, generating a priority list of interconnections from the connectivity matrix, generating placement coordinates for the compile units from the priority list of interconnections and the connectivity matrix, and generating as output at least one of the connectivity matrix and the placement coordinates.

10 Claims, 3 Drawing Sheets

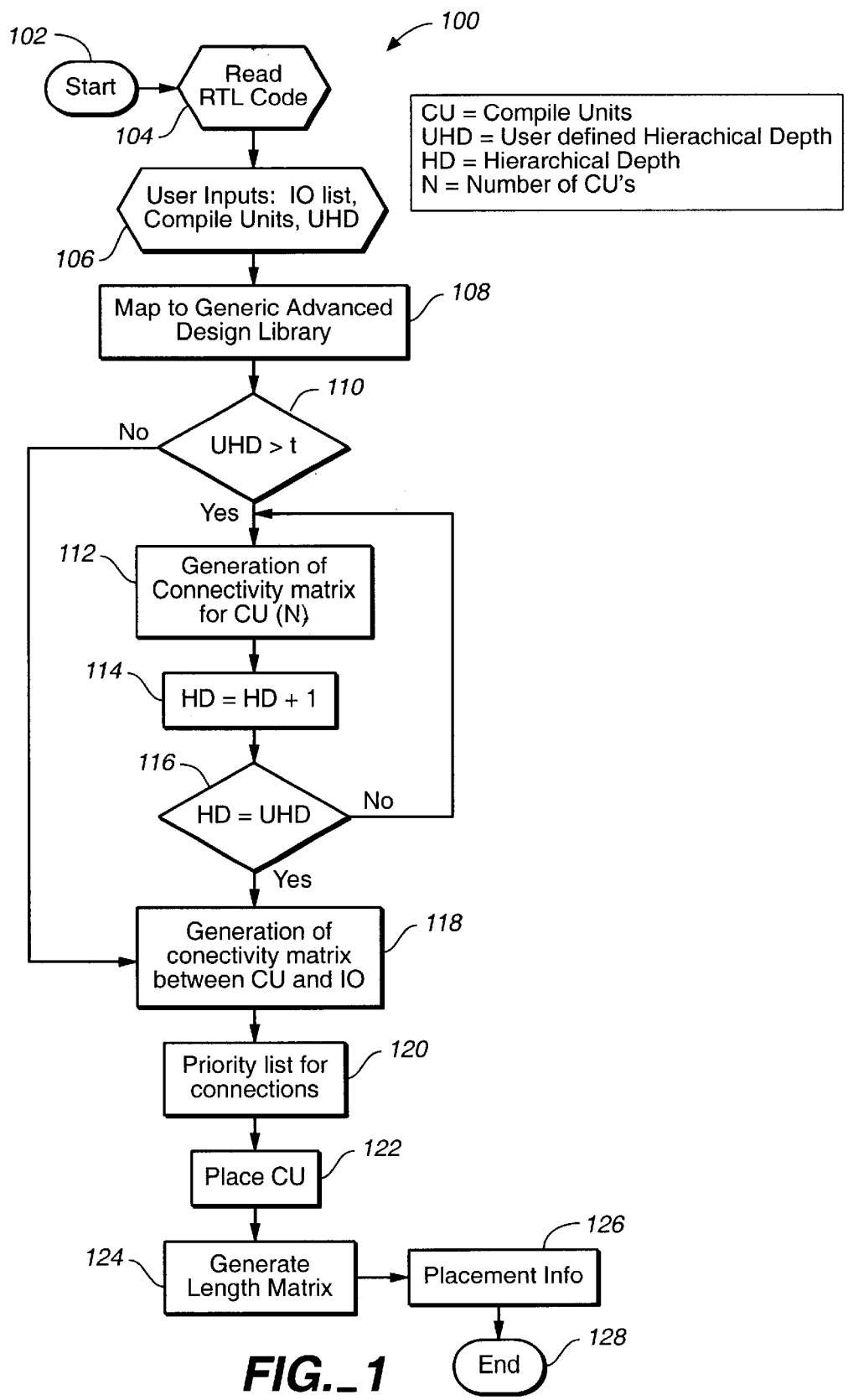
FIG._1

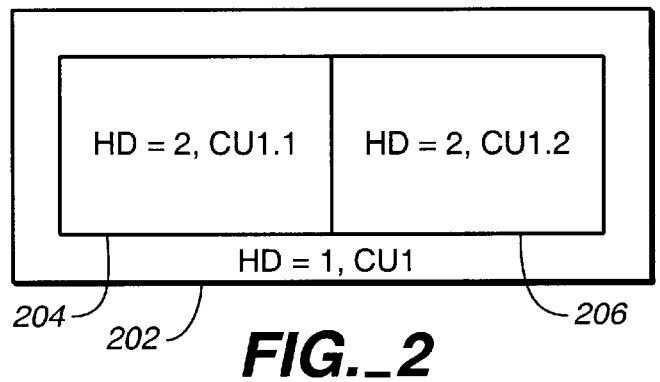
FIG._2
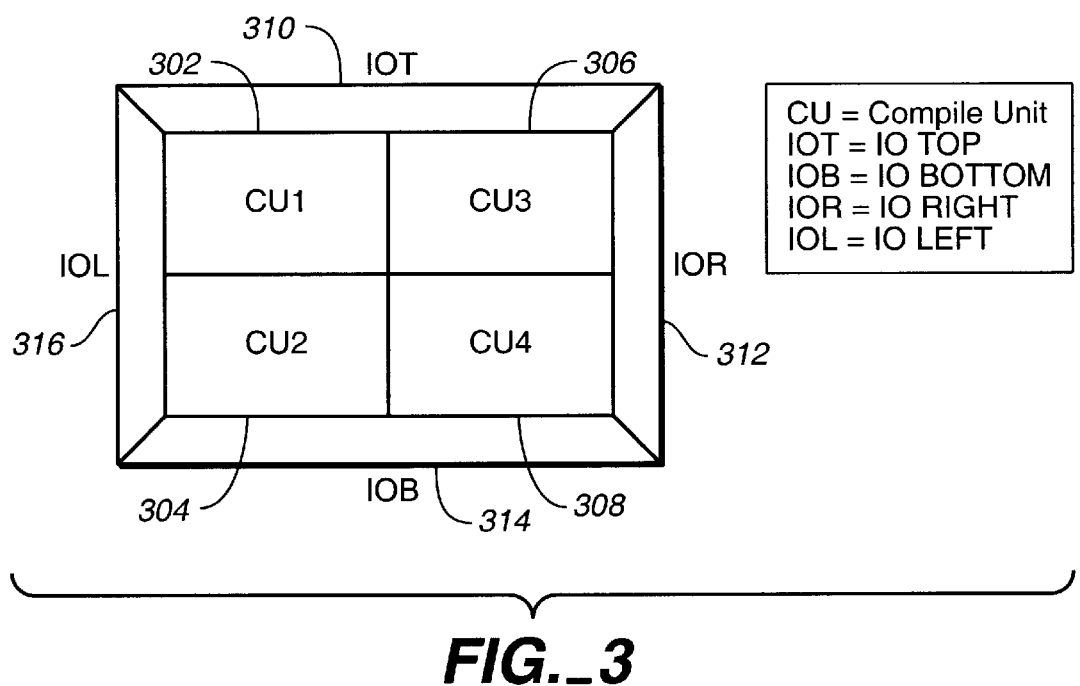
FIG._3

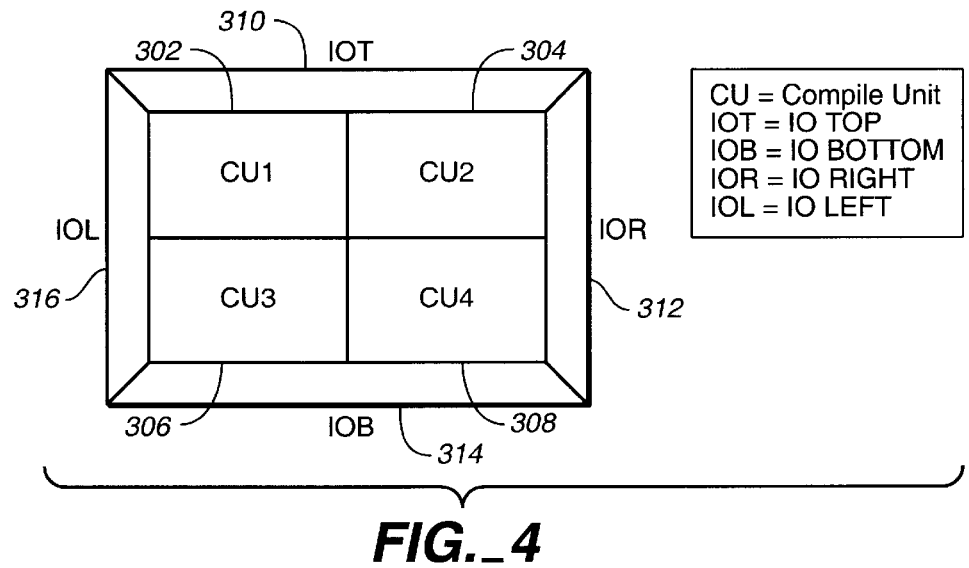
FIG._4
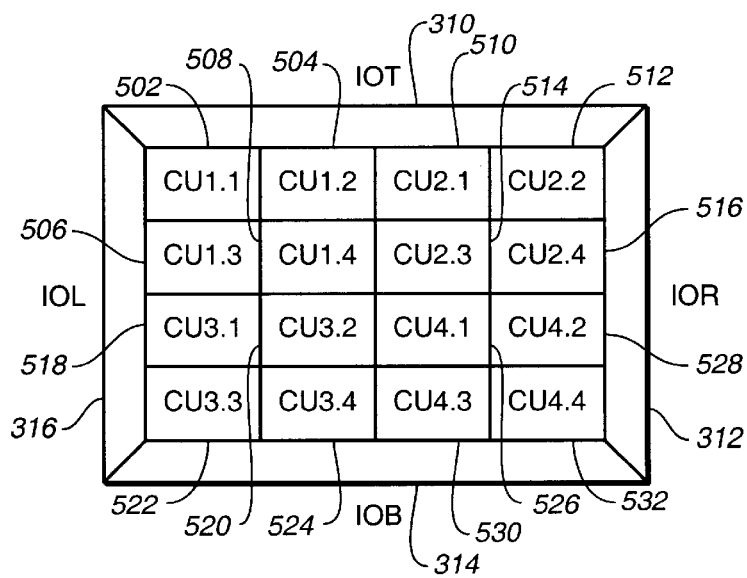
FIG._5

LENGTH MATRIX GENERATOR FOR REGISTER TRANSFER LEVEL CODE

BACKGROUND OF THE INVENTION

1. Field of the Invention

The present invention is directed to the manufacture of integrated circuits. More specifically, but without limitation thereto, the present invention is directed to a method of avoiding congestion inherent in register transfer level (RTL) code used in the design of integrated circuits.

2. Description of the Prior Art

Previously, congestion resulting from routing signals in an integrated circuit has only been estimated at the netlist cell placement stage, late in the design cycle. Multiple iterations and manually generated alternatives in the physical design phase are typically used to resolve timing and congestion problems.

SUMMARY OF THE INVENTION

In one aspect of the present invention, a method of generating a length matrix for register transfer level code includes steps for receiving as input register transfer level code, an I/O block list, a plurality of compile units, and a user defined hierarchical depth; mapping the register transfer level code to a design library, generating a connectivity matrix for the plurality of compile units, generating a priority list of interconnections from the connectivity matrix, generating placement coordinates for the compile units from the priority list of interconnections and the connectivity matrix, and generating as output at least one of the connectivity matrix and the placement coordinates.

In another aspect of the present invention, a computer program product for estimating congestion for register transfer level code includes a medium for embodying a computer program for input to a computer and a computer program embodied in the medium for causing the computer to perform steps for receiving as input a floor plan mapped from the register transfer level code, identifying regions in the floor plan, computing routing demand numbers for the regions in the floor plan, computing routing resource numbers for the regions in the floor plan, and generating a congestion estimate of the register transfer level code as a function of the routing demand numbers and the routing resource numbers.

DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart of a length matrix generator according to an embodiment of the present invention;

FIG. 2 illustrates a diagram of compile units and hierarchical depth for the flow chart of FIG. 1;

FIG. 3 illustrates a diagram of an integrated circuit design example for the flow chart of FIG. 1;

FIG. 4 illustrates an example of a placement of the compile units for the design example of FIG. 3; and FIG. 5 illustrates an example of a placement of the compile units for the design example of FIG. 3 for a user defined hierarchical depth of two.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

Previous methods of estimating congestion in an integrated circuit design are performed only at the netlist cell placement stage, which is too late in the design cycle to avoid congestion problems that may result in netlists that are unroutable or cannot meet timing requirements. Rearranging cell placement may resolve congestion at one level, but the congestion may reappear again in the detailed routing phase when the actual routing demands are known. As a result, a significant amount of added effort may be required to modify the register transfer level (RTL) code. The changes then need to be merged into the layout database, sometimes requiring a completely new layout.

Another disadvantage of previous methods of integrated circuit design is that critical paths are ignored during synthesis of the netlist because the synthesis tool is unable to meet the timing requirements of the critical paths, often resulting in a large number of critical paths in the physical design. The large number of critical paths in turn creates difficulties for the layout tools, resulting in unacceptably long layout cycles.

Still another disadvantage of typical RTL code is that complex RTL structures may not be recognized during synthesis of the netlist. Without appropriate intervention by the designer, synthesis tool runtimes may increase dramatically.

The disadvantages of typical RTL described above indicate the need for physical RTL analysis tools that can estimate how RTL coding constructs appear in terms of timing and congestion in the physical design. Specifically, the problem constructs inherent in the RTL code need to be identified, and direction needs to be provided on how to optimize the RTL code to remove the physical implementation barriers.

Congestion is a fundamental issue in very large scale integrated circuit (VLSI) design. Congestion estimation and analysis have gained increasing importance as the size and complexity of designs grow. It is therefore desirable to identify potential congestion problems early in the design cycle. Previous methods of estimating congestion are typically employed in the netlist placement phase, when the design information is lost in a multitude of gates and the placement of cells is nearly fixed. Even though congestion avoidance is the main objective of currently used global routing tools, optimization performance of these tools is minimal, because congestion is primarily due to the manner in which the RTL code was designed than to cell placement and/or netlist synthesis. Reducing utilization and increasing cell padding size may assist in reducing congestion, but not enough to avoid significant design delays. There is insufficient insight at the netlist placement phase to enable redesigning or repartitioning the design at the RTL code level. The global routing tools simply pass on the congestion problems to the next phase of the design, for example, detailed routing, or else generate timing tradeoffs.

To detect and resolve timing and congestion problems at the RTL code level, several tools are useful. One such tool is a length matrix generator for generating a connectivity matrix and a length matrix that contain the cell placement information. An RTL code mapping tool can use the information contained in the connectivity matrix and the length matrix to perform a more accurate synthesis than methods that rely on statistical models of wireloads.

In one aspect of the present invention, a method of generating a length matrix for register transfer level code includes steps for receiving as input register transfer level code, an I/O block list, a plurality of compile units, and a user defined hierarchical depth; mapping the register transfer level code to a design library, generating a connectivity matrix for the plurality of compile units, generating a priority list of interconnections from the connectivity matrix, generating placement coordinates for the compile units from the priority list of interconnections and the connectivity matrix, and generating as output at least one of the connectivity matrix and the placement coordinates.

FIG. 1 illustrates a flow chart 100 of a length matrix generator according to an embodiment of the present invention.

Step 102 is the entry point of the flow chart 100.

In step 104, the RTL code is received as input, for example, from a cell library used in the design of integrated circuits, and the hierarchical depth is initialized to one. The value of the hierarchical depth refers to the level of hierarchy in the design with respect to the top level. For example, if the value of the hierarchical depth is one, then the module instantiations at the top or first level of the design hierarchy are selected.

In step 106, an I/O block list, compile units, and a user defined hierarchical depth are received as input from a user. Compile units are modules or blocks that are identified with respect to size and partitioning in a given circuit design. Compile units and the I/O block list are design specific information that is available to the user. By default, the user defined hierarchical depth is set equal to one, that is, the connectivity matrix is generated only for the user defined compile units. If the user defined hierarchical depth is entered as two, for example, then the connectivity matrix includes the second level of hierarchy within the compile units, and so on.

FIG. 2 illustrates a diagram of compile units and hierarchical depth for the flow chart of FIG. 1. Shown in FIG. 2 are compile units (CU) 202, 204 and 206. The compile unit 202 is not included within another compile unit and has a hierarchical depth (HD) equal to one and is the highest level in the hierarchy of compile units. The compile unit 202 includes the compile units 204 and 206, therefore the compile units 204 and 206 have a hierarchical depth of two. A compile unit included in either of the compile units 204 and 206 would have a hierarchical depth of three, and so on throughout the hierarchy of compile units.

In step 108, the RTL code is mapped to a generic Advanced Format Library according to the functionality of the circuit design.

In step 110, if the user defined hierarchical depth is greater than one, then control is transferred to: step 112. Otherwise, control is transferred to step 118.

In step 112, a connectivity matrix is generated for the number N compile units having the same level of hierarchical depth. The connectivity matrix is generated by counting the connections to and from each compile unit and I/O block and tabulating the total count in a cross matrix as follows.

FIG. 3 illustrates a diagram of an integrated circuit design example for the flow chart of FIG. 1. Shown in FIG. 3 are compile units 302 (CU1), 304 (CU2), 306 (CU3) and 308 (CU4), and I/O blocks 310 (IOT), 312 (IOR), 314 (IOB) and 316 (IOL).

An example of a connectivity matrix for the integrated circuit design example of FIG. 3 is illustrated in Table 1 below.

TABLE 1

|     | CU1 | CU2 | CU3 | CU4 | IOT | IOB | IOL | IOR |
|-----|-----|-----|-----|-----|-----|-----|-----|-----|
| CU1 |     | 100 | 75  | 20  | 32  | 2   | 31  | 7   |
| CU2 | 100 |     | 25  | 50  | 30  | 6   | 8   | 29  |
| CU3 | 75  | 25  |     | 95  | 1   | 28  | 27  | 5   |
| CU4 | 20  | 50  | 95  |     | 4   | 26  | 3   | 25  |
| IOT | 32  | 30  | 1   | 4   |     |     |     |     |
| IOB | 2   | 6   | 28  | 26  |     |     |     |     |
| IOL | 31  | 8   | 27  | 3   |     |     |     |     |
| IOR | 7   | 29  | 5   | 25  |     |     |     |     |

In Table 1, the values in each of the cells represents the number of interconnects between each of the compile units and I/O blocks identified in the corresponding row and column. For example, the number of interconnects between CU1 and CU2 in the connectivity matrix for the example of Table 1 is 100.

In step 114, the hierarchical depth is incremented by one.

In step 116, if the user defined hierarchical depth equals the hierarchical depth, then control is transferred to step 118. Otherwise, control is transferred to step 112.

In step 118, the connectivity matrix between the compile units having a hierarchical depth of one and the I/O blocks is generated as described in step 112.

In step 120, a priority list for the connections is generated from the connectivity matrix as follows. The highest priority is given to interconnects between pairs of compile units and the I/O blocks having the greatest number of interconnects. The next priority is given to the greatest number of interconnects between pairs of compile units. An example of a priority list generated according to the above criteria for the connectivity matrix of Table 1 is illustrated below in Table 2.

TABLE 2

| PRIORITY | PAIR | INTERCONNECTS |
|----------|------|---------------|
| 1  | CU1/IOT | 32  |
| 2  | CU1/IOL | 31  |
| 3  | CU2/IOT | 30  |
| 4  | CU2/IOR | 29  |
| 5  | CU3/IOB | 28  |
| 6  | CU3/IOL | 27  |
| 7  | CU4/IOB | 26  |
| 8  | CU4/IOR | 25  |
| 9  | CU2/IOL | 8   |
| 10 | CU1/IOR | 7   |
| 11 | CU2/IOB | 6   |
| 12 | CU3/IOR | 5   |
| 13 | CU4/IOT | 4   |
| 14 | CU4/IOL | 3   |
| 15 | CU1/IOB | 2   |
| 16 | CU3/IOT | 1   |
| 17 | CU1/CU2 | 100 |
| 18 | CU3/CU4 | 95  |
| 19 | CU1/CU3 | 75  |
| 20 | CU2/CU4 | 50  |
| 21 | CU2/CU3 | 25  |
| 22 | CU1/CU4 | 20  |

In step 122, placement coordinates of the compile units are generated from the connectivity list and the priority list as follows.

FIG. 4 illustrates an example of a placement of the compile units for the design example of FIG. 3. Shown in FIG. 4 are compile units 302 (CU1), 304 (CU2), 306 (CU3) and 308 (CU4), and I/O blocks 310 (IOT), 312 (IOR), 314 (IOB) and 316 (IOL).

The compile unit 302 has the highest number of interconnects to the I/O blocks 310 and 316, therefore the compile unit 302 is placed closest to the I/O blocks 310 and 316. Similarly, the compile unit 304 has the highest number of interconnects to the I/O blocks 310 and 312, therefore the compile unit 304 is placed closest to the I/O blocks 310 and 312. The next highest priority is between the compile unit 306 and the I/O block 316, so the compile unit 306 is placed in the next closest available space to the I/O block 316. The compile unit 308 has the next highest priority and is placed, in this example, in the last available space.

The placement method described above applies to a user defined hierarchical depth of one, however, the same procedure may also be applied to any user defined hierarchical depth.

FIG. 5 illustrates an example of a placement of the compile units for the design example of FIG. 3 for a user defined hierarchical depth of two. Shown in FIG. 5 are compile units 502 (CU1.1), 504 (CU1.2), 506 (CU1.3), 508 (CU1.4), 510 (CU2.1), 512 (CU2.2), 514 (CU2.3), 516 (CU2.4), 518 (CU3.1), 520 (CU3.2), 522 (CU3.3), 524 (CU3.4), 526 (CU4.1), 528 (CU4.2), 530 (CU4.3), 532 (CU4.4), and I/O blocks 310 (IOT), 312 (IOR), 314 (IOB) and 316 (IOL).

In step 124, a length matrix is generated from the connectivity matrix and the placement coordinates of the compile units as follows. A unit length L may be conveniently used to represent wire length as the product of an integer times L, where L is defined as the minimum distance between the two adjacent smallest compile units. An example of a length matrix for the placement example of FIG. 5 is illustrated in Table 3 below.

TABLE 3

|  | CU1 | CU2 | CU3 | CU4 | IOT | IOB | IOL | IOR |
|---|---|---|---|---|---|---|---|---|
| CU1 |  |  |  |  |  |  |  |  |
| CU2 | L |  |  |  |  |  |  |  |
| CU3 | L | L |  |  |  |  |  |  |
| CU4 | L | L | L |  |  |  |  |  |
| IOT | L | L | 2L | 2L |  |  |  |  |
| IOB | 2L | 2L | L | L |  |  |  |  |
| IOL | L | 2L | L | 2L |  |  |  |  |
| IOR | 2L | L | 2L | L |  |  |  |  |

The length matrix illustrated in Table 3 advantageously provides a link for layout during synthesis that conveys a more accurate representation of the integrated circuit design. As a result, the netlist may be synthesized more reliably by downstream tools and floorplanning algorithms than by using wireload models.

In step 126, the length matrix and the placement coordinates are generated as output.

Step 128 is the exit point of the flow chart 100.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product and implemented by a computer according to well known programming techniques to perform steps for:

receiving as input register transfer level code, an I/O block list, a plurality of compile units, and a user defined hierarchical depth;

mapping the register transfer level code to a design library;

generating a connectivity matrix for the plurality of compile units;

generating a priority list of interconnections from the connectivity matrix;

generating placement coordinates for the compile units from the priority list of interconnections and the connectivity matrix; and generating as output at least one of the connectivity matrix and the placement coordinates.

While the invention herein disclosed has been described by means of specific embodiments and applications thereof, numerous modifications and variations may be made thereto by those skilled in the art without departing from the scope of the invention set forth ini the following claims.

What is claimed is:

1. A method of generating a length matrix for register transfer level code comprising steps for:

receiving as input register transfer level code, an I/O block list, a plurality of compile units, and a user defined hierarchical depth;

mapping the register transfer level code to a design library;

generating a connectivity matrix for the plurality of compile units;

generating a priority list of interconnections from the connectivity matrix;

generating placement coordinates for the compile units from the priority list of interconnections and the connectivity matrix; and generating as output at least one of the connectivity matrix and the placement coordinates.

2. The method of claim 1 wherein the step for generating a connectivity matrix comprises counting the interconnections between the compile units.

3. The method of claim 1 wherein the step for generating a priority list comprises sorting pairs of the compile units and the I/O blocks according to a number of interconnections therebetween.

4. The method of claim 1 wherein the step for generating placement coordinates places the compile units having a greatest number of interconnections to an I/O block closest to the I/O block.

5. The method of claim 1 wherein the user defined hierarchical depth indicates a level of hierarchy of the compile units.

6. A computer program product for estimating congestion for register transfer level code comprising:

a medium for embodying a computer program for input to a computer; and a computer program embodied in the medium for causing the computer to perform steps for:

receiving as input register transfer level code, an I/O block list, a plurality of compile units, and a user defined hierarchical depth;

mapping the register transfer level code to a design library;

generating a connectivity matrix for the plurality of compile units;

generating a priority list of interconnections from the connectivity matrix;

generating placement coordinates for the compile units from the priority list of interconnections and the connectivity matrix; and generating as output at least one of the connectivity matrix and the placement coordinates.

7. The computer program product of claim 6 wherein the step for generating a connectivity matrix comprises counting the interconnections between the compile units.

8. The computer program product of claim 6 wherein the step for generating a priority list comprises sorting pairs of the compile units and the I/O blocks according to a number of interconnections therebetween.

9. The computer program product of claim 6 wherein the step for generating placement coordinates places the compile units having a greatest number of interconnections to an I/O block closest to the I/O block.

10. The computer program product of claim 6 wherein the user defined hierarchical depth indicates a level of hierarchy of the compile units.

* * * * *